United States Patent
Welker et al.

(10) Patent No.: US 7,181,638 B2
(45) Date of Patent: Feb. 20, 2007

(54) METHOD AND APPARATUS FOR SKEWING DATA WITH RESPECT TO COMMAND ON A DDR INTERFACE

(75) Inventors: James A. Welker, Austin, TX (US); Thomas L. Thomas, Jr., Austin, TX (US); Jose M. Nunez, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 537 days.

(21) Appl. No.: 10/194,765

(22) Filed: Jul. 12, 2002

(65) Prior Publication Data

US 2004/0008069 A1    Jan. 15, 2004

(51) Int. Cl.
  G06F 1/04    (2006.01)
  G06F 1/12    (2006.01)
  G06F 5/06    (2006.01)
(52) U.S. Cl. .............. 713/600; 713/601; 713/400; 713/401; 713/500; 713/503
(58) Field of Classification Search ........... 713/600, 713/601, 400, 401, 500, 503
See application file for complete search history.

(56) References Cited

U.S. PATENT DOCUMENTS

| 6,016,282 | A | * | 1/2000 | Keeth | 365/233 |
| 6,323,705 | B1 | * | 11/2001 | Shieh et al. | 327/158 |
| 6,453,402 | B1 | * | 9/2002 | Jeddeloh | 711/167 |
| 6,643,789 | B2 | * | 11/2003 | Mullarkey | 713/401 |
| 2004/0158759 | A1 | * | 8/2004 | Chang et al. | 713/500 |
| 2004/0184308 | A1 | * | 9/2004 | Kim et al. | 365/154 |

* cited by examiner

*Primary Examiner*—Rehana Perveen
*Assistant Examiner*—Michael J. Brown
(74) *Attorney, Agent, or Firm*—Robert L. King (57) ABSTRACT

An adjustable logic circuit includes a pulse filter and delay circuit, a state machine and combinational logic circuit, and a data strobe generation circuit. The pulse filter and delay circuit is operative to read an adjustable configuration value and, based thereon, to implement a delay between an internal clock and both a data signal and a data strobe signal, the delay being a fraction of a clock period. The state machine and combinational logic circuit are operative to select a data value from a plurality of data values, and to provide a data signal based upon the data value. The data strobe generation circuit is operative to provide the data strobe signal at a time when both the data signal is valid and the delay is compatible with a predetermined external device.

38 Claims, 8 Drawing Sheets

METHOD AND APPARATUS FOR SKEWING DATA WITH RESPECT TO COMMAND ON A DDR INTERFACE

TECHNICAL FIELD

The present invention relates to DDR SDRAM, and particularly to skewing data with respect to a command on a DDR interface.

DESCRIPTION OF THE RELATED ART

One of the most interesting developments in high-speed memory technology has been the DDR SDRAMs (double data rate synchronous dynamic random access memories). While traditional DRAMs access memory locations when driven by a rising edge or a falling edge of a clock, DDR SDRAMs perform memory accesses upon both a rising edge and a falling edge of a clock signal. DDR SDRAMs can therefore achieve approximately double the data rate of traditional DRAMs.

The development of DDR SDRAMs has led to an industry-wide specification, created by the JEDEC Solid State Technology Association, a division of JEDEC (the Joint Electron Devices Engineering Council). The "Double Data Rate (DDR) SDRAM Specification" (hereinafter referred to as the "JEDEC specification") has become a JEDEC standard. The stated purpose of the JEDEC specification is to define the minimum set of requirements for JEDEC-compliant DDR SDRAMs. System designs based on the required aspects of the specification will be supported by all DDR SDRAM vendors providing JEDEC compliant devices. Compliance with the JEDEC specification is thus necessary, and not optional, for all JEDEC-compliant DDR SDRAMs. Other specifications, such as a JEDEC 42.3 Future DRAM Task group specification for DDR2, are underway. Similarly, VC cached DDR-II DRAMs and ESDRAM-Lite cached DDR-II DRAMs are also being produced.

The JEDEC specification specifies that JEDEC compliant DDR SDRAMs that produce data must also produce a data strobe, called "DQS" ("data query strobe"), to indicate that data is valid. The DQS is summarized succinctly on page 11 of the JEDEC specification, where the following pin description is given: "Data Strobe: Output with read data, input with write data. Edge-aligned with read data, centered in write data. Used to capture write data." As stated in the JEDEC specification, on page 21, during READ bursts, the valid data-out element will be available following the CAS latency after the READ command. Each subsequent data-out element will be valid nominally at the next positive or negative clock edge, DQS is driven by the DDR SDRAM along with output data. The bidirectional data strobe (DQS) is transmitted, along with data, for use in data capture at the receiver. DQS is a strobe transmitted by the DDR SDRAM during READs and by the memory controller during WRITEs. When driven by the DRAM, DQS is edge-aligned with data for READs. When DQS is driven by a memory controller, it must be center-aligned with data for WRITEs.

The timing for WRITE operations is also provided in the JEDEC specification. On page 26, the JEDEC specification indicates that the time between the WRITE command and the first corresponding rising edge of DQS (tDQSS) is specified with a relatively wide range (from 75% to 125% of 1 clock cycle). This might be described as a window during which the JEDEC compliant DDR SDRAM "looks for" data on a data bus. Devices issuing a WRITE command to a JEDEC compliant DDR SDRAM are expected to drive DQS in such a way that the signal arrives at the DRAM pins at a clock edge, plus or minus 25% of 1 clock cycle. Thus, the JEDEC compliant DDR SDRAM controller that provides data must assert the DQS at a time when the JEDEC compliant DDR SDRAM that receives the data experiences a clock edge, plus or minus 25% of 1 clock cycle.

Figure 1A:
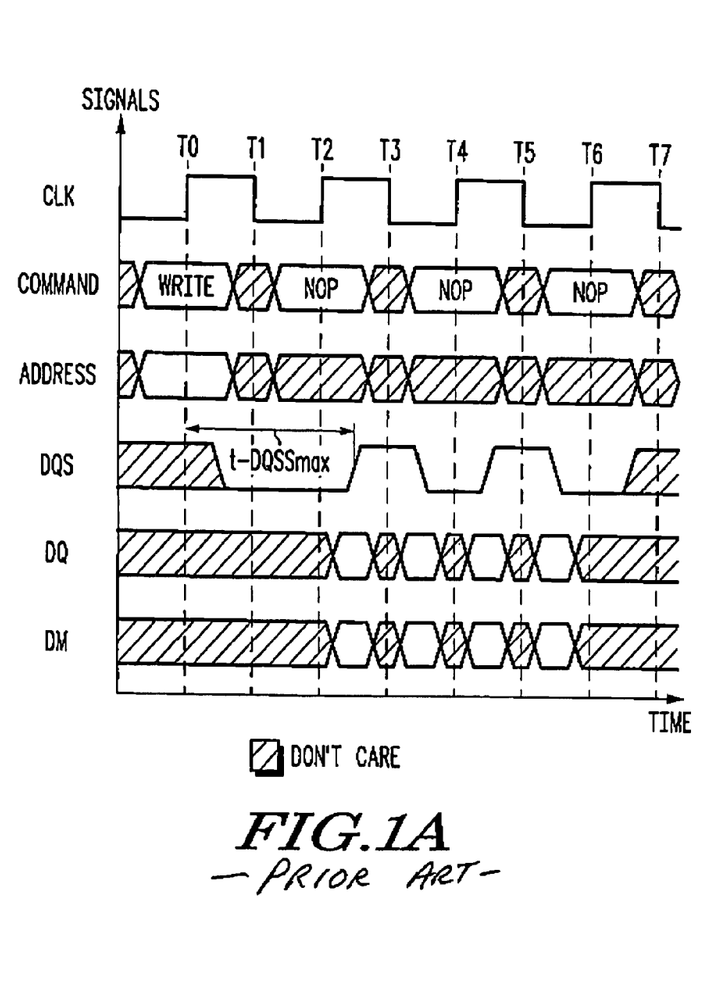
FIG. 1A is a timing diagram of a JEDEC compliant DDR SDRAM illustrating the maximum time allowed between a WRITE command and the associated DQS assertion, in accordance with the JEDEC specification.

FIG. 1A is a timing diagram of a JEDEC compliant DDR SDRAM illustrating WRITE operations, in accordance with the JEDEC specification. In the example of FIG. 1A, DQS arrives at a maximum allowable time of 125% of a clock cycle after the command was captured. A first trace depicts a system clock CK. A second trace shows a command, in this case a single WRITE command, that a memory master (i.e., a device capable of generating commands) has issued. The memory master has managed to issue the command such that the command is perfectly centered at a clock edge of the system clock CK.

Figure 1B:
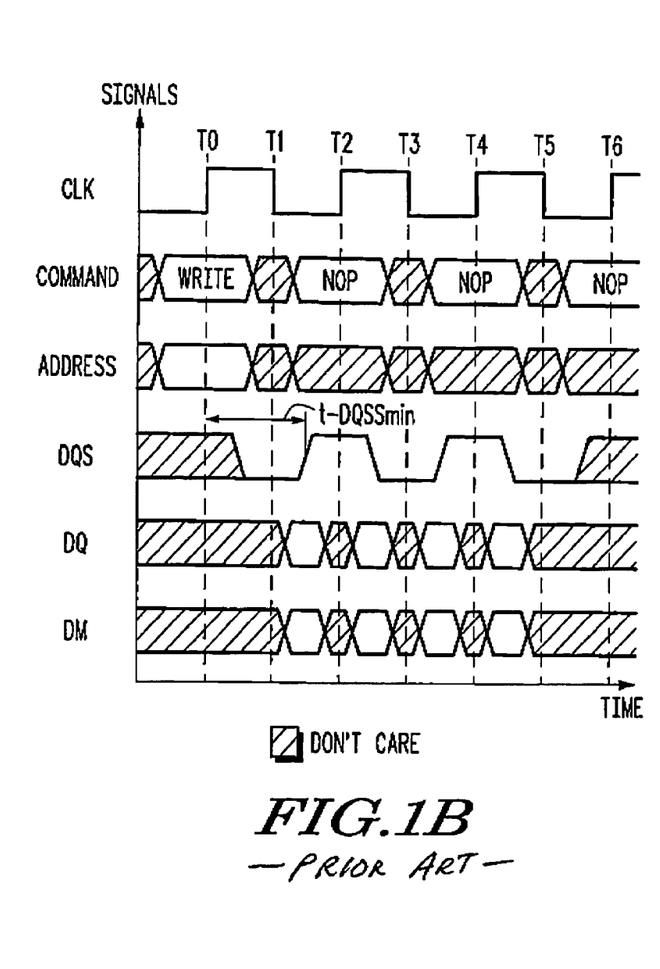
FIG. 1B is a timing diagram of a JEDEC compliant DDR SDRAM illustrating the minimum time allowed between a WRITE command and the associated DQS assertion, in accordance with the JEDEC specification.

FIG. 1B is a second timing diagram of a JEDEC compliant DDR SDRAM illustrating WRITE operations in accordance with the JEDEC specification. In the example of FIG. 1B, DQS arrives at a minimum allowable time of 75% of a clock cycle after the command was captured. A first trace depicts a system clock CK. A second trace shows a command, in this case a single WRITE command, that a memory master (i.e., a device capable of generating commands) has issued. The memory master has managed to issue the command such that the command is perfectly centered at a clock edge of the system clock CK.

FIG. 1A shows a timing diagram where DQS arrives at a maximum allowable time of 125% of a clock cycle after the command was captured, while FIG. 1B shows a timing diagram where DQS arrives at a minimum allowable time of 75% of a clock cycle after the command was captured.

Designing a memory controller, which provides the DQS signal during a WRITE within a timing window consistent with the JEDEC specification, can be complicated by the fact that the memory controller is desired to operate properly in many different system topologies. System topologies (including distance and loading) can complicate providing the DQS signal at an appropriate time. Traveling a short distance in a lightly loaded system may lead the DQS signal to arrive too early, thus violating the JEDEC specification requirement that the DQS signal arrive no earlier than 75% of a clock cycle after the command is captured. Traveling a long distance in a heavily loaded system may lead the DQS signal to arrive too late, thus violating the JEDEC specification requirement that the DQS signal arrive no later than 125% of a clock cycle after the command is captured.

The DDR SDRAM operates from a differential clock (CK and /CK; the crossing of CK going HIGH and /CK going LOW will be referred to as the positive edge of CK). Commands (address and control signals) are registered at every positive edge of CK. Input data are registered on both edges of DQS, and output data are referenced to both edges of DQS, as well as to both edges of CK.

DETAILED DESCRIPTION OF THE DRAWINGS

In accordance with one embodiment of the present invention, an adjustable logic circuit implements a digitally controlled delay between an internal clock and data and a corresponding DQS signal. The digitally controlled delay can be generated by hardware, software, a combination of hardware and software, or another adjustable configuration mechanism. The digitally controlled delay is implemented, in accordance with one embodiment of the present invention, such that only a few delay elements are needed.

Figure 2:
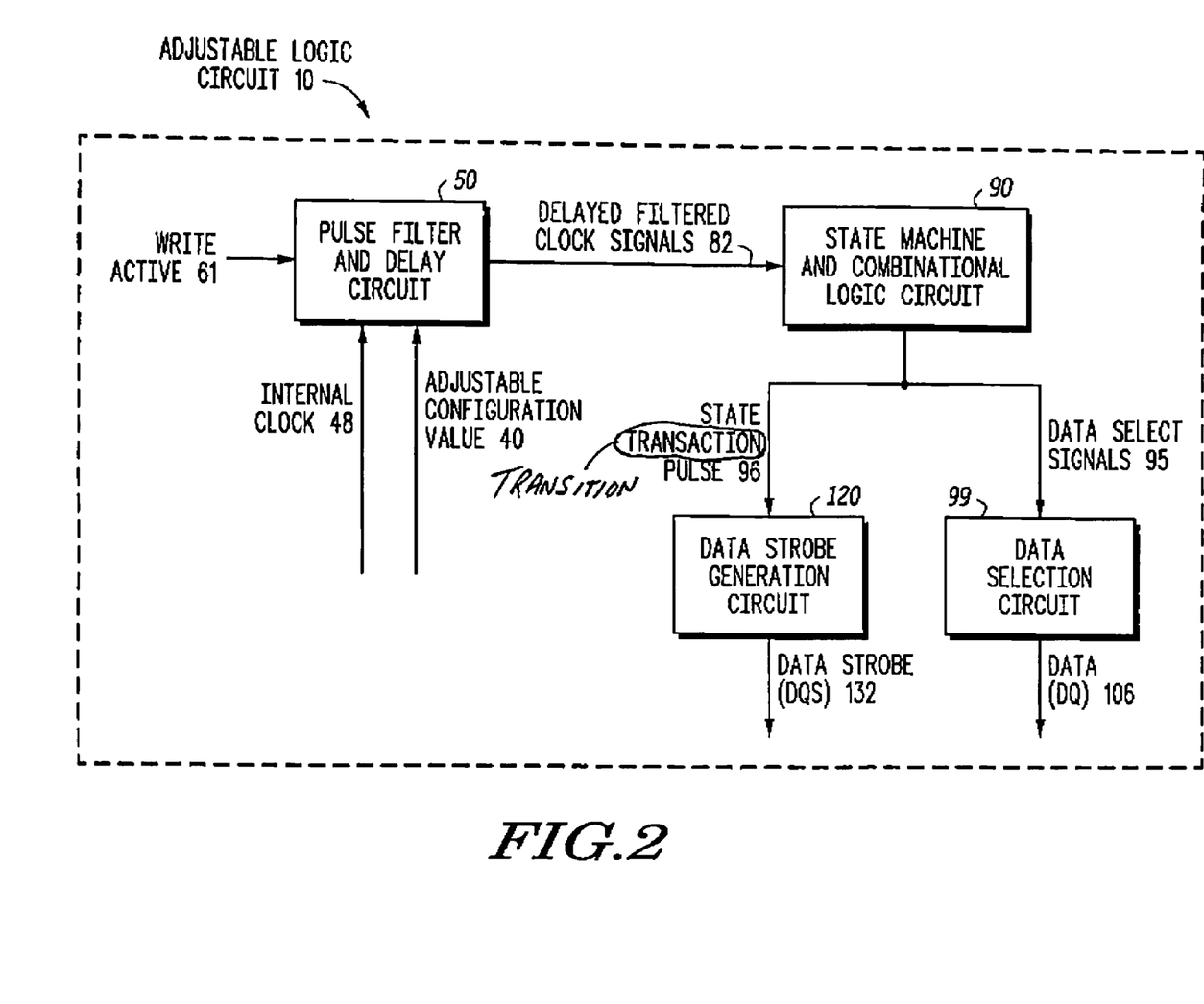
FIG. 2 shows an adjustable logic circuit in accordance with one embodiment of the present invention.

FIG. 2 shows an adjustable logic circuit 10 in accordance with one embodiment of the present invention. The adjustable logic circuit 10 includes a pulse filter and delay circuit 50, a state machine and combinational logic circuit 90, a data strobe generation circuit 120, and a data selection circuit 99. The pulse filter and delay circuit 50 receives an internal clock 48, an adjustable configuration value 40, and a WRITE active signal 61, and provides a delayed filtered clock signal 82 to the state machine and combinational logic circuit 90.

The state machine and combinational logic circuit 90 generates a state transition pulse 96 to the data strobe generation circuit 120. The data strobe generation circuit 120 generates a data strobe (DQS) 132 that is fully compliant with the JEDEC specification. The state machine and combinational logic circuit 90 also generates a plurality of data select signals 95 to a data selection circuit 99. The data selection circuit 99 generates a DATA (DQ) 106 that is fully compliant with the JEDEC specification. As shown in FIG. 2, if desired, the DATA (DQ) 106 and the data strobe (DQS) 132 may be launched separately.

In the embodiment of FIG. 2, the internal clock 48 runs at the DRAM interface frequency. If desired, the internal clock 48 may be running at an even multiple of the DRAM interface frequency, to be divided down in either the state machine and combinational logic circuit 90 (shown in FIG. 2), or in the signal splitter 52 of the pulse filter and delay circuit 50 (shown in FIG. 3).

Figure 3:
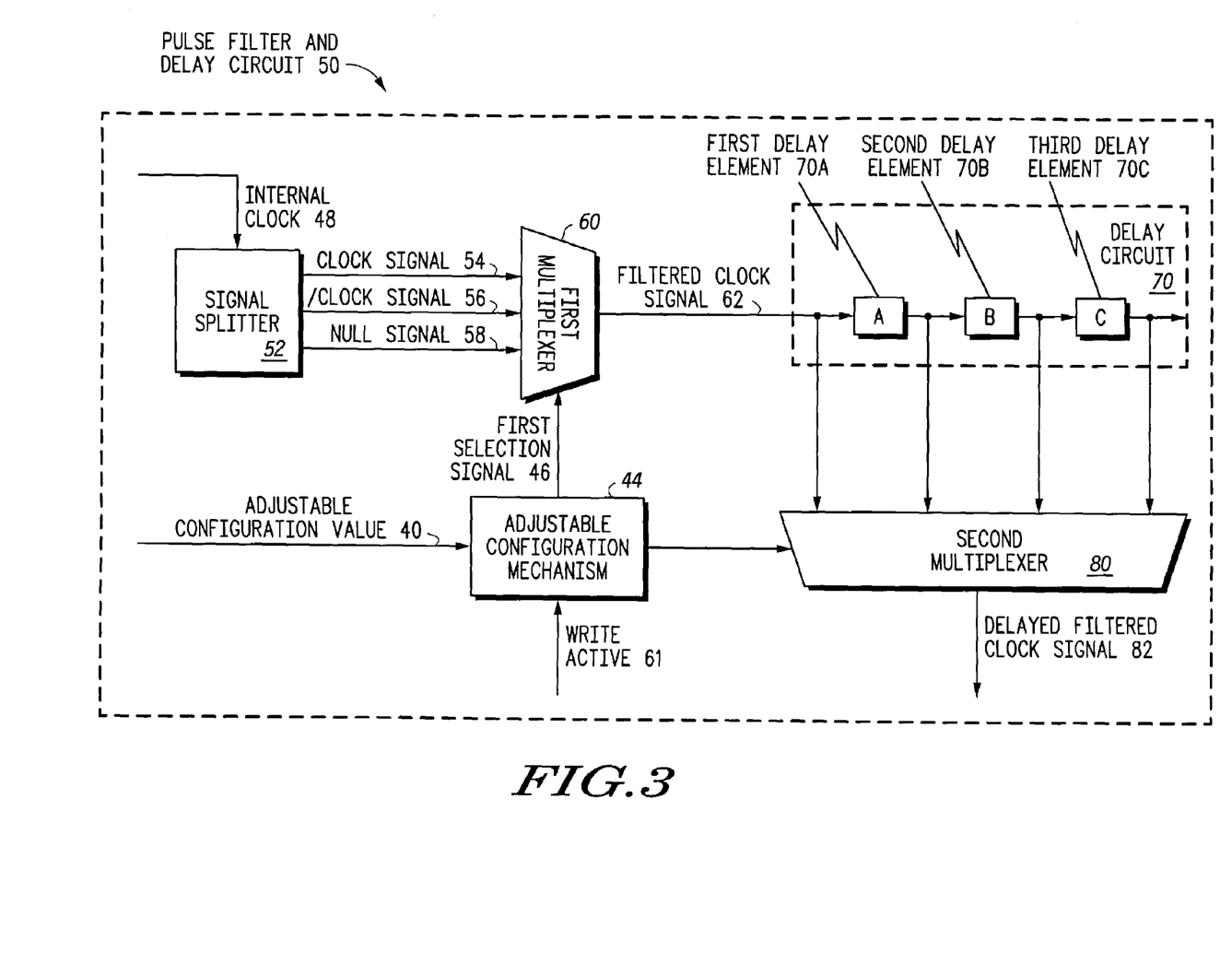
FIG. 3 is a schematic representation of a pulse filter and delay circuit of FIG. 2 in greater detail.

FIG. 3 is a schematic representation of the pulse filter and delay circuit 50 of FIG. 2 in greater detail. In accordance with one embodiment of the present invention, the pulse filter and delay circuit 50 includes an adjustable configuration mechanism 44, a signal splitter 52, a first selection circuit such as a first multiplexer 60, a delay circuit 70, and a second selection circuit, such as a second multiplexer 80. The adjustable configuration mechanism 44 may be, for example, a numerical value stored within a physical register.

If desired, the adjustable configuration mechanism 44 may be a software-determined value. In accordance with one embodiment of the present invention, the adjustable configuration mechanism 44 is a digital value stored within a register that is programmed by software or hardware (shown in FIG. 2) within the adjustable logic circuit 10. The adjustable configuration mechanism 44 receives the WRITE active signal 61, which indicates whether a WRITE command is pending.

The signal splitter 52 receives the internal clock 48 from a clock generating mechanism (not shown in FIG. 3) and creates a plurality of clock signals. For example, the signal splitter 52 creates three clock signals based upon the internal clock 48. The first of the three clock signals is simply the internal clock 48 itself, represented as a clock signal 54. The second of the three clock signals is an inverted version of the internal clock 48, represented as a /clock signal 56, where the "/" symbol indicates inversion. The third of the three clock signals is a constant (i.e., nonfluctuating) signal referred to as a "null" clock, represented as a null signal 58. In the embodiment of FIG. 3, the null signal 58 has a value of binary zero. If desired, various clocks thus created may be omitted; for example, the signal splitter 52 may be implemented to create only the clock signal 54 and the /clock signal 56. The null signal 58 is used when there is no WRITE command in process.

The pulse filter and delay circuit 50 also includes a first selection circuit that selects one of the plurality of clock signals. In accordance with one embodiment of the present invention, the first selection circuit includes the first multiplexer 60 that selects a clock signal from among the plurality of clock signals to obtain a selected clock signal, designated as a filtered clock signal 62. The adjustable configuration mechanism 44 controls the first multiplexer 60, in accordance with an adjustable configuration value 40 and WRITE active 61 from the memory controller (indicating whether there is a WRITE in progress). The first selection signal 46 may be several bits in width.

Each of the clock signals among the plurality of clock signals provides an input to the first multiplexer 60. The inverted version of the internal clock 48 (represented as the /clock signal 56) may also be regarded as a phase-shifted version of the internal clock 48, where the phase shift is 180-degrees. The first multiplexer 60 may thus be said to coarsely "filter" the internal clock 48 in accordance with the adjustable configuration value 40 to provide the filtered clock signal 62, where the filtering is either allowing a clock pulse to enter the delay circuit 70 or not allowing a clock pulse to enter the delay circuit 70, via selecting the null signal 58.

The pulse filter and delay circuit 50 also includes a delay circuit 70 that includes a sequence of delay elements 70a–70c coupled in series. For example, each of the delay elements 70a–70c may be a logic gate or series of logic gates, such as a pair of inverters in sequence. The filtered clock signal 62 is provided to a first delay element 70a of the sequence of delay elements. A second delay element 70b receives an output from the first delay element 70a; a third delay element 70c receives an output from the second delay element 70b, and so forth. Although only three delay elements 70a–c are shown in FIG. 3, any number may be used. Each delay element introduces a further phase shift relative to the internal clock 48.

It will be appreciated that the number of delay elements is reduced by 50% by the availability of both the internal clock 48 itself, represented as the clock signal 54, and the inverted version of the internal clock 48, represented as the / clock signal 56, where the "/" symbol indicates inversion.

It will be appreciated that fractional clock cycle delays may be achieved without a need for a 2× (or higher order) clock, and therefore may be used when only a 1× clock is available. A "1× clock" indicates that the internal clock 48 frequency is the same as the DRAM interface frequency.

The embodiment of FIG. 3 shows a granularity of ⅛ of a clock cycle, which is reflected in the timing diagram of FIG. 4 (described below). This granularity is believed to be sufficient to accommodate a range of 75%–125% of a clock cycle described in the JEDEC specification. If additional granularity is needed, for example if the JEDEC specification is revised or if a board design calls for additional granularity, the amount of delay introduced by each delay element may be decreased or increased. If desired, additional or fewer delay elements may be used. The delay elements need not introduce identical delay; one delay element may be provided that introduces greater or lesser delay than another delay element.

The output of each delay element is also provided to a second selection circuit, such as the second multiplexer 80. The second multiplexer 80 receives as inputs the outputs (and/or the inputs) of various delay elements of the delay circuit 70, and selects one of the outputs (and/or the inputs) in accordance with the adjustable configuration value 40. The second multiplexer 80 has "selects" that may be combinationally derived from the adjustable configuration value 40. Since the inputs to the second multiplexer 80 are identical to one another, but for a delay, the second multiplexer 80 may be said to introduce a selectable further phase shift relative to the internal clock 48. The second multiplexer 80 may thus be said to finely delay the internal clock 48 after the coarse filtering performed by the first multiplexer 60 in accordance with the adjustable configuration value 40. The second multiplexer 80 provides the delayed filtered clock signal 82.

An example may serve to illustrate the function of the second multiplexer 80. In accordance with one embodiment of the present invention, each delay element introduces a delay equivalent to ⅛ of a full period of the internal clock 48, and only three such delay elements are included. When no delay is desired, the first multiplexer 60 selects the internal clock 48 itself, represented as the clock signal 54. The second multiplexer 80 selects the input of the first delay element 70a, for a combined delay of nearly zero.

When a delay of ⅛ of a full period of the internal clock 48 is desired, the first multiplexer 60 selects the internal clock 48, and the second multiplexer 80 selects the output of the first delay element 70a for a combined delay of ⅛ of a full period of the internal clock 48. When a delay of ¼ of a full period of the internal clock 48 is desired, the first multiplexer 60 selects the internal clock 48 itself, and the output of the second delay element 70b is selected by the second multiplexer 80, for a combined delay of ¼ of a full period of the internal clock 48. When a delay of ⅜ of a full period of the internal clock 48 is desired, the first multiplexer 60 selects the internal clock 48 itself, and the output of the third delay element 70c is selected by the second multiplexer 80, for a combined delay of ⅜ of a full period of the internal clock 48.

A similar technique may be used when other delays are desired. When a delay of ½ of a full period of the internal clock 48 is desired, the inverted version of the internal clock 48, represented as the /clock signal 56, is selected by the first multiplexer 60. The inverted version of the internal clock 48 is equivalent to a delay of ½ of a full period of the internal clock 48. The input of the first delay element 70a is selected by the second multiplexer 80, for a combined delay of ½ of a full period of the internal clock 48. When a delay of ⅝ of a full period of the internal clock 48 is desired, the inverted version of the internal clock 48, represented as the /clock signal 56, is selected by the first multiplexer 60, and the output of the first delay element 70a is selected by the second multiplexer 80, for a combined delay of ⅝ of a full period of the internal clock 48.

When a delay of ¾ of a full period of the internal clock 48 is desired, the first multiplexer 60 selects the inverted version of the internal clock 48, and the output of the second delay element 70b is selected by the second multiplexer 80, for a combined delay of ¾ of a full period of the internal clock 48. When a delay of ⅞ of a full period of the internal clock 48 is desired, the first multiplexer 60 selects the inverted version of the internal clock 48, and the second multiplexer 80 selects the output of the third delay element 70c, for a combined delay of ⅞ of a full period of the internal clock 48.

Figure 4:
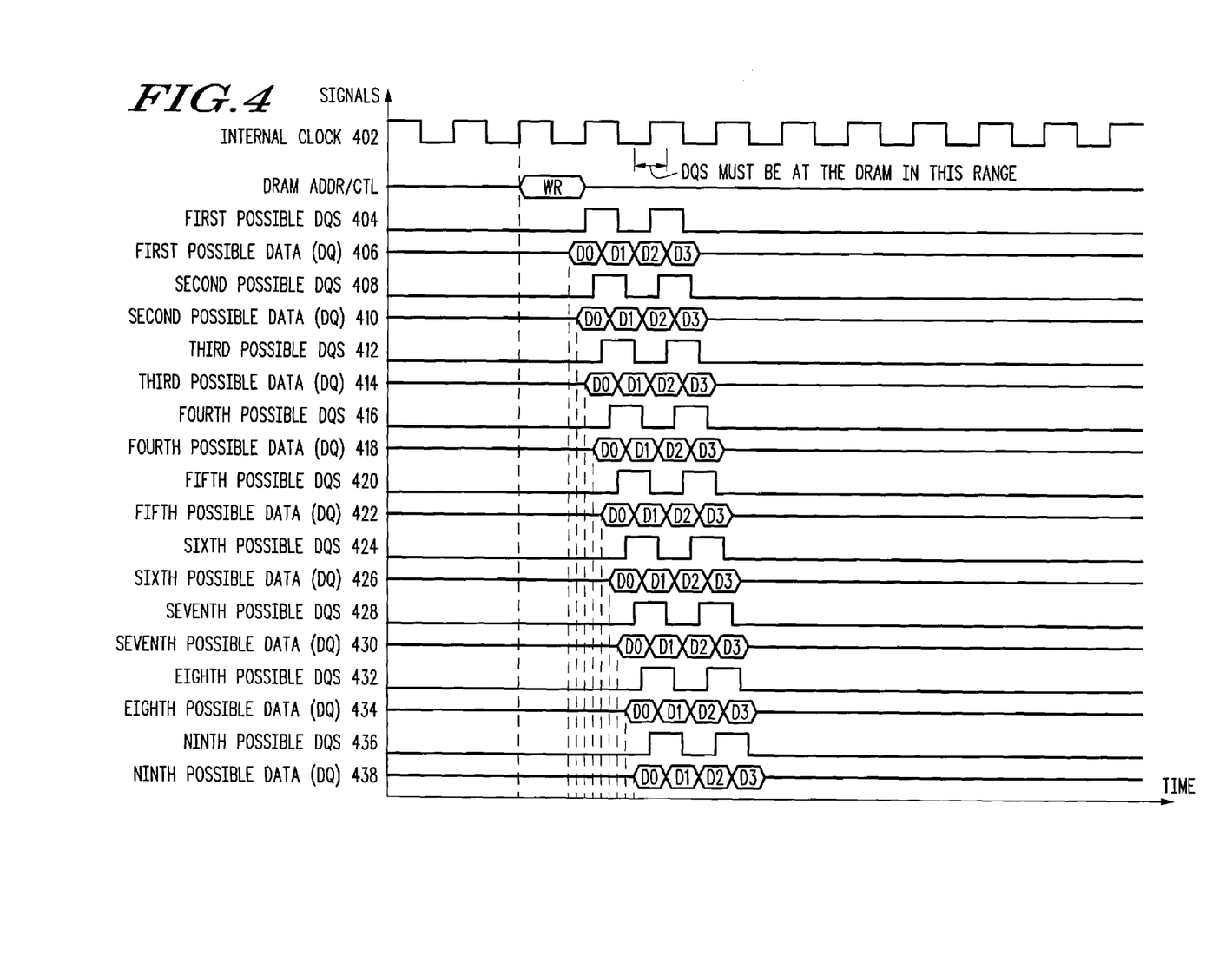
FIG. 4 is a timing diagram that shows how data and DQS may be delayed by the pulse filter and delay circuit, in accordance with the embodiment of FIG. 2.

FIG. 4 is a timing diagram that shows how data and DQS may be delayed by the adjustable logic circuit 10 (i.e., the memory controller transmit structure), in accordance with the embodiment of FIG. 2. A first trace shows an internal clock 402.

With respect to a first option implementing a delay of ¾ of a full period of the internal clock 402 (representing the clock signal 54, shown in FIG. 3), a first possible DQS 404 and a first possible DATA (DQ) 406 are delayed with respect to the internal clock 402. The inversion is equivalent to a 180-degree phase shift (i.e., the filtered clock signal 62, shown in FIG. 3) implemented by the selection of the inverted version of the internal clock 402 (represented as the / clock signal 56, shown in FIG. 3), added to a ¼ clock cycle delay introduced by the second delay element 70b (shown in FIG. 3) that is selected by the second multiplexer 80 (shown in FIG. 3), for a combined delay of ¾ of a full period of the internal clock 402.

With respect to a second option implementing a delay of ⅞ of a full period of the internal clock 402, a second possible DQS 408 and a second possible DATA (DQ) 410 are delayed with respect to the internal clock 402. The delay is equivalent to a 180-degree phase shift (i.e., the filtered clock signal 62, shown in FIG. 3) implemented by the selection of the inverted version of the internal clock 402 (represented as the /clock signal 56, shown in FIG. 3), added to a ⅜ clock cycle delay introduced by the third delay element 70c (shown in FIG. 3) that is selected by the second multiplexer 80 (shown in FIG. 3), for a combined delay of ⅞ of a full period of the internal clock 402.

With respect to a third option implementing the internal clock 402 without any delay, a third possible DQS 412 and a third possible DATA (DQ) 414 are not delayed with respect to the internal clock 402. The delay is equivalent to a 0-degree phase shift (i.e., the filtered clock signal 62, shown in FIG. 3) implemented by the selection of the internal clock 402 itself (represented as the clock signal 54, shown in FIG. 3), to which nothing is added (since the second multiplexer 80, shown in FIG. 3, receives the input to the first delay element 70a, also shown in FIG. 3, and does not add additional delay).

With respect to a fourth option implementing a delay of ⅛ of a full period of the internal clock 402, a fourth possible DQS 416 and a fourth possible DATA (DQ) 418 are delayed with respect to the internal clock 402. The delay is equivalent to a 0-degree phase shift (i.e., the filtered clock signal 62, shown in FIG. 3) implemented by the selection of the internal clock 402 itself (represented as the clock signal 54, shown in FIG. 3), added to a ⅛ clock cycle delay introduced by the first delay element 70a (shown in FIG. 3) selected by the second multiplexer 80 (shown in FIG. 3), for a combined delay of ⅛ of a full period of the internal clock 402.

With respect to a fifth option implementing a delay of ¼ of a full period of the internal clock 402, a fifth possible DQS 420 and a fifth possible DATA (DQ) 422 are delayed with respect to the internal clock 402. The delay is equivalent to a 0-degree phase shift (i.e., the filtered clock signal 62, shown in FIG. 3) implemented by the selection of the internal clock 402 itself (represented as the clock signal 54, shown in FIG. 3), added to a ¼ clock cycle delay introduced by the second delay element 70b (shown in FIG. 3) selected by the second multiplexer 80 (shown in FIG. 3), for a combined delay of ¼ of a full period of the internal clock 402.

With respect to a sixth option implementing a delay of ⅜ of a full period of the internal clock 402, a sixth possible DQS 424 and a sixth possible DATA (DQ) 426 are delayed with respect to the internal clock 402. The delay is equivalent to a 0-degree phase shift (i.e., the filtered clock signal 62, shown in FIG. 3) implemented by the selection of the internal clock 402 itself (represented as the clock signal 54, shown in FIG. 3), added to a ⅜ clock cycle delay introduced by the third delay element 70c (shown in FIG. 3) selected by the second multiplexer 80 (shown in FIG. 3), for a combined delay of ⅜ of a full period of the internal clock 402.

With respect to a seventh option implementing the internal clock 402 without any delay, a seventh possible DQS 428 and a seventh possible DATA (DQ) 430 are not delayed with respect to the internal clock 402. The delay is equivalent to a 180-degree phase shift (i.e., the filtered clock signal 62, shown in FIG. 3) implemented by the selection of the inverted version of the internal clock 402 (represented as the / clock signal 56, shown in FIG. 3), to which nothing is added (since the second multiplexer 80, shown in FIG. 3, receives the input to the first delay element 70a, also shown in FIG. 3, and does not add additional delay).

With respect to an eighth option implementing the internal clock 402 without any delay, an eighth possible DQS 432 and an eighth possible DATA (DQ) 434 are delayed with respect to the internal clock 402. The delay is equivalent to a 180-degree phase shift (i.e., the filtered clock signal 62, shown in FIG. 3) implemented by the selection of the inverted version of the internal clock 402 (represented as the /clock signal 56, shown in FIG. 3), to which ⅛ cycle is added (since the second multiplexer 80, shown in FIG. 3, receives the output of the first delay element 70a, also shown in FIG. 3, adding ⅛ of a cycle delay).

With respect to a ninth option implementing the internal clock 402 without any delay, a ninth possible DQS 436 and a ninth possible DATA (DQ) 438 are delayed with respect to the internal clock 402. The delay is equivalent to a 180-degree phase shift (i.e., the filtered clock signal 62, shown in FIG. 3) implemented by the selection of the inverted version of the internal clock 402 (represented as the /clock signal 56, shown in FIG. 3), to which ¼ cycle is added (since the second multiplexer 80, shown in FIG. 3, receives the output of the first delay element 70a, also shown in FIG. 3, adding ¼ of a cycle delay).

It will be understood that other arrangements of the pulse filter and delay circuit 50 are also suitable for use in the adjustable logic circuit 10. For example, the first multiplexer 60, the second multiplexer 80, and the signal splitter 52 may be rearranged into another order. If desired, the second multiplexer 80 may be configured to receive and finely delay the internal clock 48, the signal splitter 52 may be configured to receive an output from the second multiplexer 80, and the first multiplexer 60 may be configured to receive and coarsely filter an output of the second multiplexer 80. Also, various functions of the first multiplexer 60, the second multiplexer 80, and the signal splitter 52 may be combined into a single structure, or performed by additional structures not herein described. Some of the functions of the first multiplexer 60, the second multiplexer 80, and the signal splitter 52 may be performed in hardware, software, or combinations of hardware and software.

In accordance with another embodiment of the present invention, and as a further example of the other arrangements of the pulse filter and delay circuit 50 that are also suitable, multiple clocks may be provided. For example, two or more clocks may be included with respect to the internal clock 48.

Figure 5:
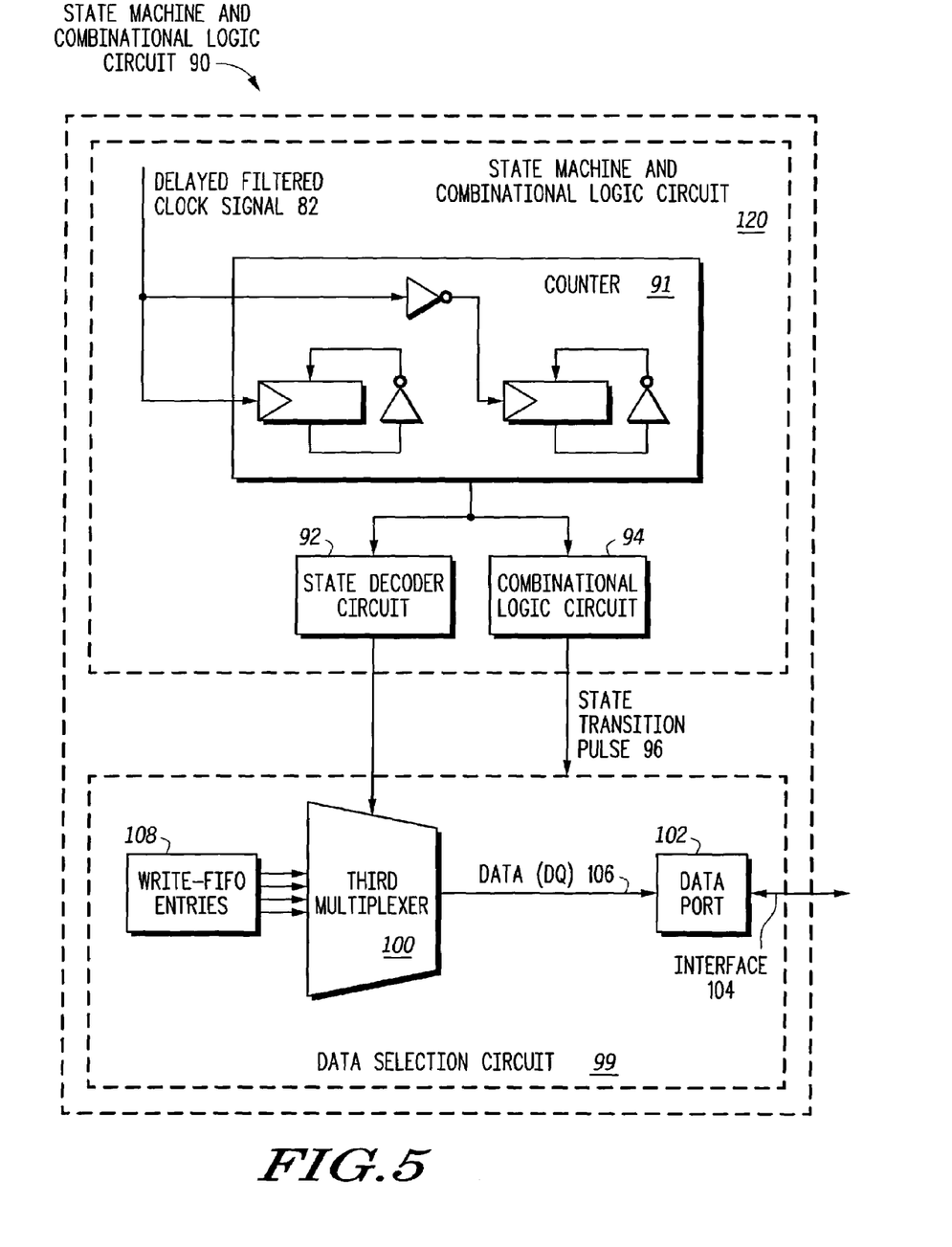
FIG. 5 is a schematic representation of a state machine and combinational logic circuit, in accordance with the adjustable logic circuit of FIG. 2.

FIG. 5 is a schematic representation of the state machine and combinational logic circuit 90, in accordance with the adjustable logic circuit 10 of FIG. 2. The state machine and combinational logic circuit 90 includes the counter 91 that receives the delayed filtered clock signal 82. The counter 91 is, for example, a state machine. Advantageously, the counter 91 is clocked by the delayed filtered clock signal 82 rather than by the internal clock 48 itself, and need not count sequentially, but may provide a binary number upon each state transition that is in accordance with a sequence of binary numbers. The counter 91 generates the binary number to both a state decoder circuit 92 and a combinational logic circuit 94, both of which generate various signals based upon the binary number. The combinational logic circuit 94 may be, for example, an XOR gate.

The counter 91 provides the binary number, via the state decoder circuit 92, as a select signal to a third selection circuit such as a third multiplexer 100. Via the third multiplexer 100, the state machine and combinational logic circuit 90 selects one of various write-FIFO entries 108 (from "first-in, first-out" entries) in response to each clock cycle of the delayed filtered clock signal 82. The write-FIFO entries 108 contain data that is placed in the write-FIFO entries 108 by a data access circuit (not shown). Data in the write FIFO entries 108 is generated by a processor or other mechanism that is using the memory controller to interface with the DDR SDRAM. Accordingly, the third multiplexer 100 selects data from one of the write-FIFO entries 108 and provides the data as a DATA (DQ) 106 to a data port 102 (such as a data pin) on an interface 104. The number of write FIFO entries 108 may be four.

Figure 6:
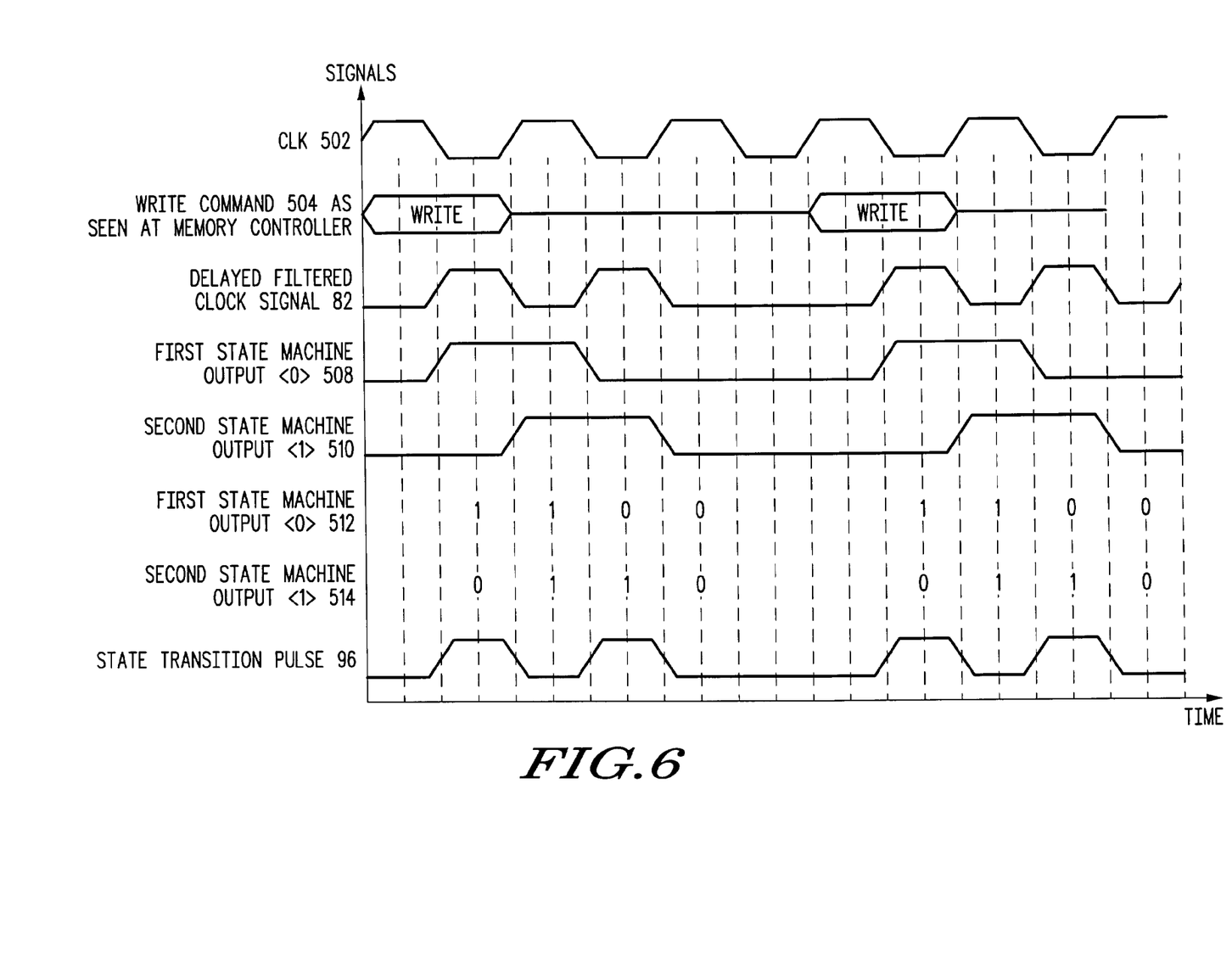
FIG. 6 is a timing diagram of a sequence implemented by the state machine and combinational logic circuit 90, in accordance with the embodiment of FIG. 5.

FIG. 6 is a timing diagram of a sequence implemented by the state machine and combinational logic circuit 90, in accordance with the embodiment of FIG. 5 and in accordance with the adjustable logic circuit 10 of FIG. 2. Specifically, the timing diagram of FIG. 6 shows a response of the state machine and combinational logic circuit 90 to a WRITE command. In responding to the WRITE command, the JEDEC compatible DDR SDRAM expects DQS to arrive on a DQS pin, and expects valid data to arrive on the data bus when the DQS arrives on the DQS pin. The JEDEC compatible DDR SDRAM then captures the data internally.

A first trace shows a clock, identified as CK 502. The second trace shows a WRITE command 504 (as seen at the memory controller). The WRITE command 504 is shown at the pins of the memory controller. In response to the WRITE command 504, the delayed filtered clock signal 82 clocks the state machine. A first state machine output <0> 508 representing a higher order bit of the binary number, and a second state machine output <1> 510 representing a lower order bit of the binary number, are obtained from the counter 91 (shown in FIG. 5). The first state machine output <0> 508 and the second state machine output <1> 510 are shown as digital values in the first state machine output <0> 512 and in the second state machine output <1> 514. A final trace of FIG. 6 shows a timing of the state transition pulse 96.

Figure 7:
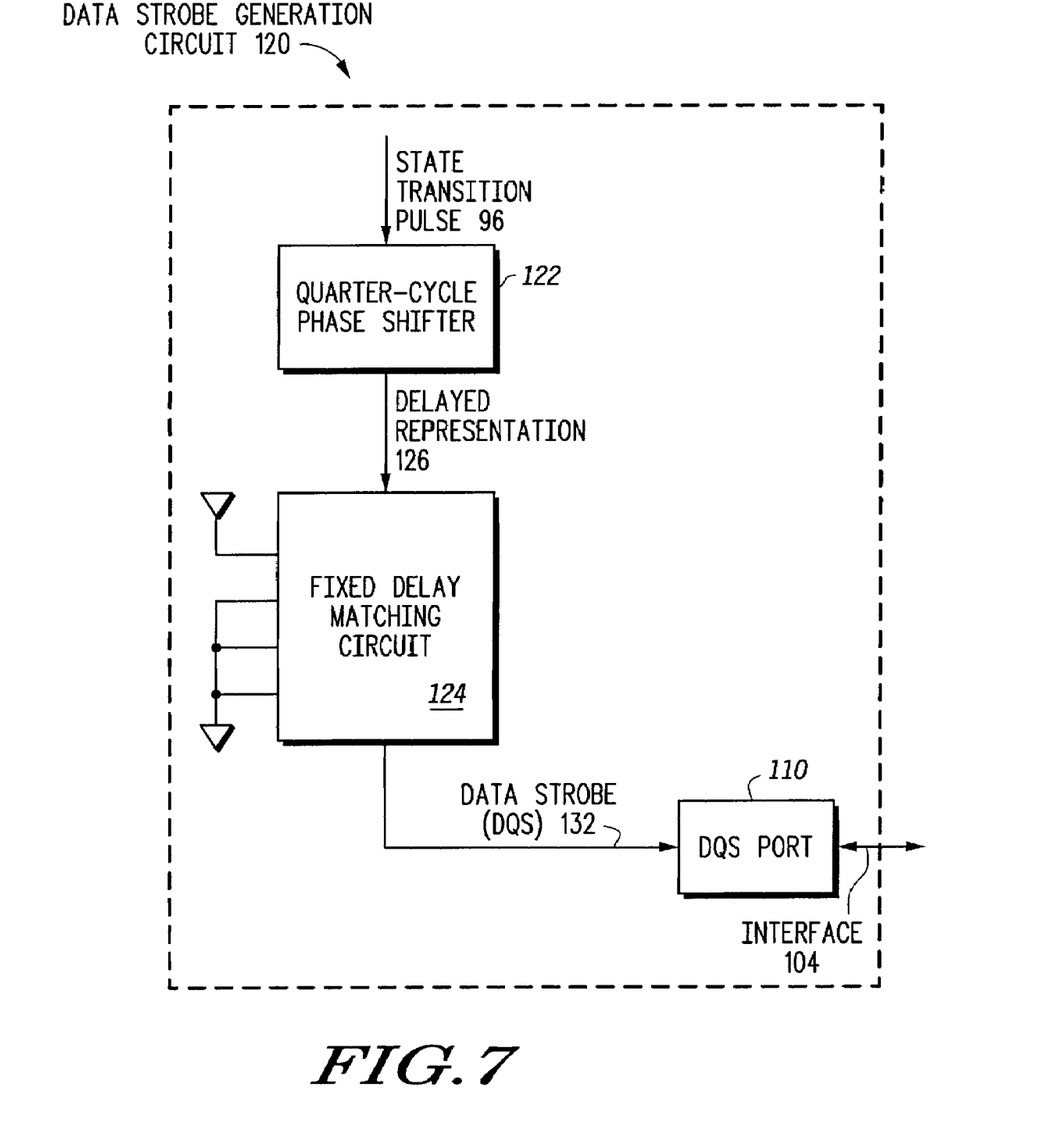
FIG. 7 is a schematic representation of a data strobe generation circuit, in accordance with the adjustable logic circuit of FIG. 2.

FIG. 7 is a schematic representation of a data strobe generation circuit 120, in accordance with the adjustable logic circuit 10 of FIG. 2. The data strobe generation circuit 120 includes a quarter-cycle phase shifter 122 and the fixed delay matching circuit 124. The quarter-cycle phase shifter 122 receives the state transition pulse 96 from the state machine and combinational logic circuit 90 (shown in FIG. 5), and produces a delayed representation 126 that is phase-shifted relative to the state transition pulse 96 by a quarter-cycle of the external clock. The quarter-cycle phase shifter 122 ensures that the DQS signal is centered within the data that is provided as the DATA (DQ) 106 (shown in FIG. 5) to the data port on the interface. The JEDEC specification requires that the DQS signal be centered with respect to the DATA (DQ) 106 (shown in FIG. 5).

The fixed delay matching circuit 124 receives the delayed representation 126, and further compensates for delays inherent in the memory controller itself. The fixed delay matching circuit 124 provides the data strobe (DQS) 132, which is fully compliant with the JEDEC specification. The fixed delay matching circuit 124 may be used to ensure the DQS to DATA (DQ) relationship. The JEDEC specification requires that the DQS signal be centered with respect to the DATA (DQ). For example, the fixed delay matching circuit 124 may be a multiplexer with a delay that is approximately equal to the delay of the third multiplexer 100 of the data selection circuit 99 (shown in FIG. 5). The fixed delay matching circuit 124 may be replaced with any delay element having a delay that is approximately equal to the delay of the third multiplexer 100 of the data selection circuit 99.

As indicated above with respect to FIG. 2, the DATA (DQ) 106 (shown in FIG. 5) and the data strobe (DQS) 132 (shown in FIG. 7) are launched separately. The DATA (DQ) 106 is launched by the third multiplexer 100 to a data port 102 (such as a data pin) on an interface 104, while the data strobe (DQS) 132 is launched by the fixed delay matching circuit 124 to a DQS port 110 on the interface 104.

Figure 8:
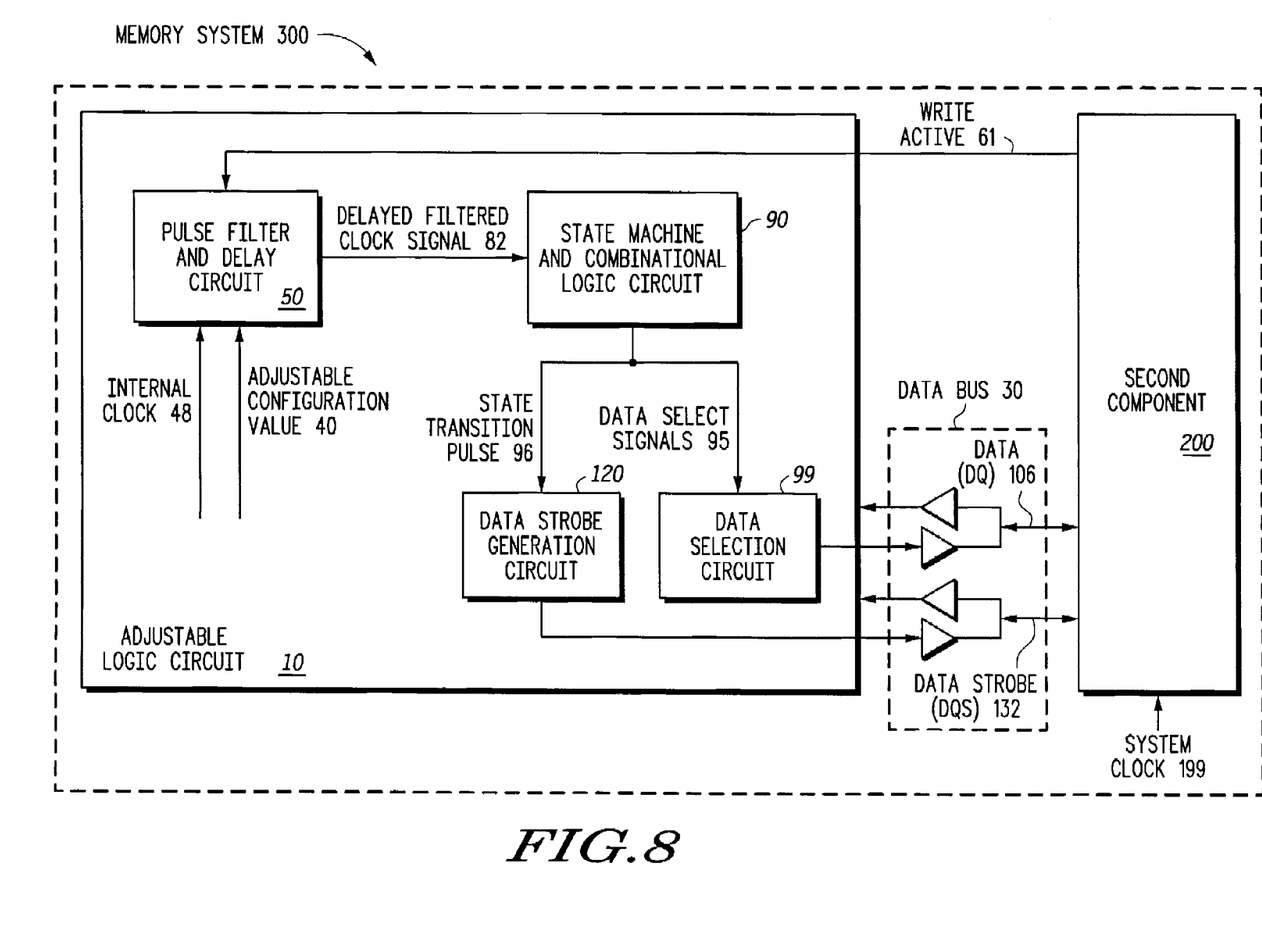
FIG. 8 is a schematic diagram of a memory system, in accordance with one embodiment of the present invention.

FIG. 8 is a schematic diagram of a memory system 300, in accordance with one embodiment of the present invention. The memory system 300 includes an adjustable logic circuit 10, and a second component 200 coupled to the adjustable logic circuit 10 via a data bus 30. The memory system 300 may also include other components.

The second component 200 operates on a system clock 199 with a predetermined clock period, and requires that a data strobe (DQS) 132 arrive at the second component 200 within 25% of the predetermined clock period from a rising edge of the system clock. The second component 200 also requires data to arrive at the second component 200 on the data bus 30, and that the data is valid when the data strobe (DQS) 132 arrives.

It will be recalled that the requirement that the data strobe (DQS) 132 be generated within 25% of a clock cycle is imposed to comply with a JEDEC specification. If another criteria is specified, the timing can be adjusted accordingly. Accordingly, as new JEDEC specifications are issued in the future, other variations of the foregoing can easily be implemented to comply with the new JEDEC specifications.

The adjustable logic circuit 10 delays delivery of the data and of the data strobe (DQS) 132 until a time of the internal clock 48 that is appropriate relative to the system clock 199.

The adjustable logic circuit 10 includes the pulse filter and delay circuit 50, the state machine and combinational logic circuit 90, and the data strobe generation circuit 120. The pulse filter and delay circuit 50 receives the internal clock 48, the adjustable configuration value 40, and the WRITE active 61, and provides the delayed filtered clock signal 82 to the state machine and combinational logic circuit 90.

The state machine and combinational logic circuit 90 generates the state transition pulse 96 to the data strobe generation circuit 120. The data strobe generation circuit 120 generates the data strobe (DQS) 132 that is fully compliant with the JEDEC specification. A time relationship between the data strobe (DQS) 132 from the data strobe generation circuit 120 and the DATA (DQ) 106 on the data bus 30 is fully compliant with the JEDEC specification. The state machine and combinational logic circuit 90 also generates a plurality of data select signals 95 to a data selection circuit 99. The data selection circuit 99 generates a DATA (DQ) 106 that is fully compliant with the JEDEC specification.

In the embodiment of FIG. 2, the internal clock 48 runs at the DRAM interface frequency. If desired, the internal clock 48 may be running at an even multiple of the DRAM interface frequency, to be divided down either within the state machine and combinational logic circuit 90 or within the signal splitter 52 (shown in FIG. 3).

It will be understood that the foregoing description is merely an example of the invention, which is not limited by such description, but rather by the claims and their equivalents. The foregoing description is made only by way of example and not as a limitation to the scope of the invention. The teachings of the foregoing disclosure will suggest other modifications to those persons skilled in the relevant art, including some modifications that may involve other features which are already known and which may be used instead of or in addition to features already described herein.

The scope of the disclosure herein also includes any novel feature or any novel combination of features disclosed either explicitly or implicitly or any generalization or modification thereof which would be apparent to persons skilled in the relevant art, whether or not such relates to the same invention as presently claimed in any claim and whether or not it mitigates any or all of the same technical problems as confronted by the present invention. The applicants hereby reserve the right to formulate new claims to such features and/or combinations of such features during the prosecution of the present application or of any further application derived therefrom.

What is claimed is:

1. An adjustable logic circuit comprising:
a pulse filter and delay circuit operative to read an adjustable configuration value and to provide a delayed filtered clock signal of an internal clock, the pulse filter and delay circuit selecting either the internal clock or a complement of the internal clock in response to the adjustable configuration value and delaying a selected signal by a predetermined amount to provide the delayed filter clock signal;
a state machine and combinational logic circuit, operative to provide a data select signal to select a data value from any or a plurality of stored data values to provide a data signal based upon a current state of the state machine and combinational logic circuit in response to the delayed filtered clock signal, the state machine and combinational logic circuit providing a state transition signal; and a data strobe generation circuit operative to provide a data strobe signal in response to the state transition signal, the data strobe signal indicating when both the data signal is valid and delay of the delayed filter clock signal is compatible with a predetermined component, the internal clock having a substantially same frequency as an interface frequency with the predetermined component.

2. The adjustable logic circuit of claim 1, wherein the data strobe generation circuit is operative to provide the data strobe signal at a time when both the data signal is valid and the delay is compatible with a JEDEC specification JESD79.

3. The adjustable logic circuit of claim 1 wherein the pulse filter and delay circuit further comprises:
   a plurality of clock signals including at least two of: a first clock signal, a second clock signal that is 180 degrees out of phase from the first clock signal, and a null clock signal;
   a multiplexer operative to select a selected clock signal from the plurality of clock signals, thereby to filter the selected clock signal in accordance with the adjustable configuration value and to provide a multiplexer output; and
   a delay circuit operative to delay the multiplexer output by any of a predetermined set of delays, in accordance with the adjustable configuration value, the delay circuit providing a delayed filtered clock signal.

4. The adjustable logic circuit of claim 3 further comprising the data strobe generating circuit operative to generate a data strobe in accordance with a signal from the state machine and combinational logic circuit in accordance with a state of the state machine and combinational logic circuit.

5. The adjustable logic circuit of claim 3 wherein the pulse filter and delay circuit is further operative to clock the state machine and combinational logic circuit into a new state based upon the delayed filtered clock signal.

6. The adjustable logic circuit of claim 5 wherein the state machine and combinational logic circuit is a counter operative to transition in accordance with a fixed count sequence.

7. The adjustable logic circuit of claim 5 further comprising a combinational logic circuit operative to provide a data strobe generating circuit input to the data strobe generating circuit based upon a current state of the state machine and combinational logic circuit, the data strobe generating circuit operative to generate the data strobe signal in response thereto.

8. The adjustable logic circuit of claim 7 wherein the data strobe signal from the data strobe generating circuit is a delayed representation of the data strobe generating circuit input that is delayed by a quarter-cycle of an interface clock period on an interface.

9. The adjustable logic circuit of claim 7 wherein the data strobe signal from the data strobe generating circuit is a delayed representation of the data strobe generating circuit input that is delayed both by a quarter-cycle of an interface clock period on an interface and by a further fixed delay matching circuit.

10. The adjustable logic circuit of claim 1 wherein the adjustable configuration value is programmed by software.

11. The adjustable logic circuit of claim 1 wherein the adjustable configuration value is programmed by hardware.

12. The adjustable logic circuit of claim 1 wherein the adjustable configuration value is programmed by configuration pins.

13. The adjustable logic circuit of claim 1 wherein the adjustable configuration value is determined automatically by a configuration value determination mechanism.

14. A system comprising:
   a system component having timing constraints; and
   an adjustable logic circuit to implement delays between an internal clock and both a data signal and a data strobe signal, the delays being fractions of a clock period, the adjustable logic circuit comprising:
   a pulse filter and delay circuit operative to read an adjustable configuration value and to provide a delayed filtered clock signal of an internal clock, the pulse filter and delay circuit selecting either the internal clock or a complement of the internal clock in response to the adjustable configuration value and delaying a selected signal by a predetermined amount to provide the delayed filter clock signal;
   a state machine and combinational logic circuit, operative to provide a data select signal as a control signal to a multiplexor circuit to select a data value from any of a plurality of stored data values to provide a data signal based upon a current state of the state machine and combinational logic circuit in response to the delayed filtered clock signal; and
   a data strobe generation circuit operative to provide the data strobe signal at a time when both the data signal is valid and the delay is compatible with the system component.

15. The system of claim 14, wherein the data strobe generation circuit is operative to provide the data strobe signal at a time when both the data signal is valid and the delay is compatible with a JEDEC specification JESD79.

16. The system of claim 14 wherein the pulse filter and delay circuit further comprises:
   a plurality of clock signals including at least two of: a first clock signal, a second clock signal that is 180 degrees out of phase from the first clock signal, and a null clock signal;
   a multiplexer operative to select a selected clock signal of the plurality of clock signals, thereby to filter the selected clock signal, in accordance with the adjustable configuration value; and
   a delay circuit operative to delay the multiplexer output by any of a predetermined set of delays, in accordance with the adjustable configuration value, the delay circuit providing a delayed filtered clock signal.

17. The system of claim 16 wherein the adjustable logic circuit further comprises a data strobe generating circuit operative to generate a data strobe in accordance with a signal from the state machine and combinational logic circuit in accordance with a state of the state machine and combinational logic circuit.

18. The system of claim 16 wherein the pulse filter and delay circuit is further operative to clock the state machine and combinational logic circuit into a new state based upon the delayed filtered clock signal.

19. The system of claim 18 wherein the state machine and combinational logic circuit is a counter operative to transition in accordance with a fixed count sequence.

20. The system of claim 18 further comprising a combinational logic circuit operative to provide the data strobe generating circuit input based upon a current state of the state machine and combinational logic circuit, the data strobe generating circuit operative to generate the data strobe signal in response thereto.

21. The system of claim 20 wherein the data strobe signal from the data strobe generating circuit is a delayed representation of the data strobe generating circuit input that is delayed by a quarter-cycle of an interface clock period on an interface.

22. The system of claim 20 wherein the data strobe signal from the data strobe generating circuit is a delayed representation of the data strobe generating circuit input that is delayed both by a quarter-cycle of an interface clock period on an interface and by a further fixed delay matching circuit.

23. The system of claim 14 wherein the adjustable configuration value is programmed by software.

24. The system of claim 14 wherein the adjustable configuration value is programmed by hardware.

25. The system of claim 14 wherein the adjustable configuration value is programmed by configuration pins.

26. The system of claim 14 wherein the adjustable configuration value is determined automatically by a configuration value determination mechanism.

27. A method for implementing a plurality of delays between an internal clock and both a data signal and a data strobe signal, each of the plurality of delays being a fraction of a clock period, the method comprising steps of:
    reading an adjustable configuration value;
    providing a delayed filtered clock signal by selecting either an interal clock signal or a complement thereof in response to the adjustable configuration value and delaying a selected one of these signals by a predetermined amount determined by the configuration value;
    selecting a data value from any of a plurality of stored data values in response to a data signal that is based upon a current state of logic circuitry responding to the delayed filtered clock signal; and
    providing a data strobe signal having a delay at a time when both the data signal is valid and the delay is compatible with a predetermined component.

28. The method of claim 27, wherein the step of providing the data strobe signal is performed at a time when both the data signal is valid and the delay is compatible with a JEDEC specification JESD79.

29. The method of claim 28 wherein the step of generating the data strobe signal in accordance with a state includes a step of providing the data strobe signal such that the data strobe signal is delayed by a quarter-cycle of an interface clock period, with respect to the delayed filtered clock signal.

30. The method of claim 29 wherein the step of generating the data strobe signal in accordance with a state includes a step of providing the data strobe signal such that the data strobe signal is further delayed by a further fixed delay.

31. The method of claim 27 wherein the step of providing a delayed filtered clock signal further comprises steps of:
    selecting at least two of: a first clock signal, a second clock signal that is 180 degrees out of phase from the first clock signal, and a null clock signal;
    selecting one of the plurality of clock signals, to provide a filtered clock signal, in accordance with the adjustable configuration value; and
    delaying a filtered clock signal by any of a predetermined set of delays, in accordance with the adjustable configuration value, to provide the delayed filtered clock signal.

32. The method of claim 31 further comprising a stop of generating the data strobe signal in accordance with a predetermined state of the logic circuitry.

33. The method of claim 32 further comprising a step of clocking an existing state into a new state based upon the delayed filtered clock signal.

34. The method of claim 33 wherein the step of clocking the state includes a step of transitioning in accordance with a fixed count sequence.

35. The method of claim 27 further comprising a step of programming the adjustable configuration value by software.

36. The method of claim as 27 further comprising a step of programming the adjustable configuration value by hardware.

37. The method of claim 27 further comprising a step of programming the adjustable configuration value by configuration pins.

38. The method of claim 27 further comprising a step of programming the adjustable configuration value by a configuration value determination mechanism.

* * * * *

UNITED STATES PATENT AND TRADEMARK OFFICE
CERTIFICATE OF CORRECTION

| | | |
|---|---|---|
| PATENT NO. | : 7,181,638 B2 | Page 1 of 1 |
| APPLICATION NO. | : 10/194765 | |
| DATED | : February 20, 2007 | |
| INVENTOR(S) | : James A. Welker | |

It is certified that error appears in the above-identified patent and that said Letters Patent is hereby corrected as shown below:

In Column 10, Line 62, Claim No. 1:

Change "or" to --of--

In Column 14, Line 17, Claim No. 32:

Change "stop" to --step--

Signed and Sealed this

Twentieth Day of May, 2008

JON W. DUDAS
*Director of the United States Patent and Trademark Office*